United States Patent
Jang et al.

(10) Patent No.: US 9,339,990 B2
(45) Date of Patent: May 17, 2016

(54) APPLICATION OF METALLIC GLASS COATING FOR IMPROVING FATIGUE RESISTANCE OF ALUMINUM ALLOYS

(71) Applicant: National Central University, Taoyuan County (TW)

(72) Inventors: Jason Shiang Ching Jang, Taoyuan County (TW); Pei Hua Tsai, Tainan (TW); Jia Bin Li, Taoyuan County (TW); Yi Zong Zhang, Taoyuan County (TW); Chih Chiang Fu, Kaohsiung (TW); Jinn. P Chu, Taoyuan County (TW)

(73) Assignee: NATIONAL CENTRAL UNIVERSITY, Jhongli, Taoyuan County (TW)

( * ) Notice: Subject to any disclaimer, the term of this patent is extended or adjusted under 35 U.S.C. 154(b) by 656 days.

(21) Appl. No.: 13/667,947

(22) Filed: Nov. 2, 2012

(65) Prior Publication Data

US 2013/0105300 A1    May 2, 2013

(30) Foreign Application Priority Data

Nov. 2, 2011   (TW) .............................. 100139979 A

(51) Int. Cl.
*C23C 14/35*   (2006.01)
*B32B 15/01*   (2006.01)
(Continued)

(52) U.S. Cl.
CPC ............... *B32B 15/017* (2013.01); *C22C 1/002* (2013.01); *C22C 45/10* (2013.01); *C23C 14/024* (2013.01);
(Continued)

(58) Field of Classification Search
CPC .......... C22C 9/00; C22C 45/10; C22C 1/002; C22C 30/02; C22C 45/001; C23C 14/14; C23C 14/16; C23C 14/025; C23C 14/024; C23C 14/185; C23C 14/028; C23C 14/165; C23C 30/005; C23C 30/00; C23C 14/34; B32B 15/017; Y10T 428/12736; Y10T 428/12743; Y10T 428/1275; Y10T 428/12806; Y10T 428/12882; Y10T 428/12903; Y10T 428/24975; Y10T 428/12993

See application file for complete search history.

(56) References Cited

U.S. PATENT DOCUMENTS

2008/0190521 A1 * 8/2008 Loffler et al. ................. 148/538

FOREIGN PATENT DOCUMENTS

| CN | 101768718 A | 7/2010 |
|---|---|---|
| CN | 102051532 A | 5/2011 |
| TW | 201122125 A | 7/2011 |

OTHER PUBLICATIONS

Jang et al, "Thermal and mechanical properties of the Zr53Cu30Ni9Al8 based bulk metallic glass microalloyed with silicon," Journal of Alloys and Compounds, 2009, pp. 215-219, vol. 478.

*Primary Examiner* — Michael E La Villa
(74) *Attorney, Agent, or Firm* — Muncy, Geissler, Olds & Lowe, P.C.

(57) ABSTRACT

A Zr-based or Zr—Cu based metallic glass thin film (MGTF) coated on aluminum alloy substrate and a method of fabricating the metallic glass and MGTF coated on aluminum alloy substrate are disclosed. The Zr-based metallic glass thin film-coated aluminum alloy substrate of the present invention comprises: an aluminum alloy substrate; and a Zr-based metallic glass thin film located on the substrate, in which the Zr-based metallic glass is represented by the formula of $(Zr_aCu_bNi_cAl_d)_{100-x}Si_x$, wherein $45 \leq a \leq 75$, $25 \leq b \leq 35$, $5 \leq c \leq 15$, $5 \leq d \leq 15$, $0.1 \leq x \leq 10$. The Zr—Cu-based metallic glass thin film coated substrate of the present invention comprises: an aluminum alloy substrate; a Zr—Cu-based metallic glass thin film located on the aluminum alloy substrate, in which the Zr—Cu-based metallic glass is represented by the formula of $(Zr_eCu_fAl_gAg_h)_{100-y}Si_y$, wherein $35 \leq e \leq 55$, $35 \leq f \leq 55$, $5 \leq g \leq 15$, $5 \leq h \leq 15$, $0.1 \leq y \leq 10$.

11 Claims, 1 Drawing Sheet

(51) Int. Cl.
 C22C 45/10 (2006.01)
 C23C 14/02 (2006.01)
 C23C 14/18 (2006.01)
 C22C 1/00 (2006.01)

(52) U.S. Cl.
 CPC ............ *C23C 14/028* (2013.01); *C23C 14/185* (2013.01); *Y10T 428/1275* (2015.01); *Y10T 428/12743* (2015.01); *Y10T 428/12903* (2015.01)

APPLICATION OF METALLIC GLASS COATING FOR IMPROVING FATIGUE RESISTANCE OF ALUMINUM ALLOYS

CROSS REFERENCE TO RELATED APPLICATION

This application claims the benefits of the Taiwan Patent Application Serial Number 100139979, filed on Nov. 2, 2011, the subject matter of which is incorporated herein by reference.

BACKGROUND OF THE INVENTION

1. Field of the Invention

The present invention relates to a substrate coated with metallic glass thin film and a method of fabricating the same and, more particularly, to a substrate coated with zirconium-based or zirconium-copper-based metallic glass thin film and a method of fabricating the same.

2. Description of Related Art

Aluminum alloys are used in many places as they have advantages of being light, anti-corrosive, etc. For example, 7075-T6, which is a high-tensile aluminum alloy, is often used in aircraft at the wing-section or the body-section. However, due to frequent pressurization and decompression during landing or departing of the aircraft, fatigue cracks may occur in the machine body, and stress may be accumulated at those fatigue cracks, which finally will result in fatigue damage. The formation of a fatigue crack includes three phases: crack initiation, crack propagation, and final fast fracture. Crack initiation comprises slip zone initiation and grain boundary initiation, which is caused by periodic fatigue loading that forms the slip zone caused by the dislocation of the atoms inside the material. The slip zone may cause intrusion or extrusion and result with cracks incurred on the surface of the material.

Therefore, it is an elusive target to mitigate the extrusion of the slip zone, as well as to postpone the initiation and the growing of the fatigue crack. So as to provide an improved coating film which can improve the mechanical properties, the fatigue behavior, and have excellent hardness, Young's modulus, endurance limit, fatigue life, and roughness, the following invention has been developed.

SUMMARY OF THE INVENTION

The present invention provides a substrate coated with zirconium-based metallic glass thin film, which comprises: a substrate made of aluminum alloy; and a zirconium-based metallic glass thin film made of zirconium-based metallic glass, which locates on (e.g. covers) the surface of the substrate, and the zirconium-based metallic glass is represented by the following formula 1,

$(Zr_aCu_bNi_cAl_d)_{100-x}Si_x$, [formula 1]

wherein $45 \leq a \leq 75$, $25 \leq b \leq 35$, $5 \leq c \leq 15$, $5 \leq d \leq 15$, $0.1 \leq x \leq 10$.

The substrate coated with zirconium-based metallic glass thin film of the present invention can improve many mechanical properties, such as fatigue behavior, surface roughness, hardness, etc, compared to an un-coated aluminum alloy substrate, and therefore is able to lengthen the lifespan of the aluminum alloy substrate. Hence, the present invention can be applied to, for example, aviation, shipbuilding, motor industry, bicycle industry, and other equipment requiring materials with excellent fatigue properties, so as to improve the lifespan of the equipment.

"An amorphous metal" means that the metal atoms in the amorphous metal have no long-term continuous regular arrangement, but only short term-regular arrangement. Amorphous metals also can be called liquid metals or non-crystalline metals, or glassy metals or metallic glass, due to their similar behavior to glass in lacking long-term continuous regular arrangement. Long-term continuous regular arrangement of metal atoms usually occurs when an alloy is cooled with a slow cooling rate. In contrast, metallic glass alloys are formed when the alloy is cooled with a very fast cooling rate, e.g. 106 to 1010K/sec. Under an X-ray diffraction test, a broad band can be observed with the metallic glass alloys at a low diffraction angle (i.e. 2θ=30 to 50 degree), while a sharp peak is revealed with a crystalline metal alloy.

According to the substrate coated with zirconium-based metallic glass thin film of the present invention, the formula 1 is preferably $(Zr_{53}Cu_{30}Ni_9Al_8)_{99.5}Si_{0.5}$.

According to the substrate coated with zirconium-based metallic glass thin film of the present invention, the surface roughness of substrate coated with zirconium-based metallic glass thin film is preferably 3.5 nm to 5.5 nm such as 4.5 nm.

According to the substrate coated with zirconium-based metallic glass thin film of the present invention, preferably, the fatigue life of the substrate coated with zirconium-based metallic glass thin film is $1 \times 10^5$ to $1 \times 10^6$ times (e.g. $5 \times 10^5$ times) with stress of 300 MPa, or is $1 \times 10^6$ to $1 \times 10^7$ (e.g. $5 \times 10^6$ times) times with stress of 250 MPa as measured by a curving fatigue test.

According to the substrate coated with zirconium-based metallic glass thin film of the present invention, the fatigue life of the substrate coated with zirconium-based metallic glass thin film is about 10 to 30 times (e.g. 22 times) that of the fatigue life of an uncoated aluminum alloy substrate.

According to the substrate coated with zirconium-based metallic glass thin film of the present invention, the fatigue endurance of the substrate coated with zirconium-based metallic glass thin film is preferably 200 MPa to 300 MPa, such as 235 MPa.

According to the substrate coated with zirconium-based metallic glass thin film of the present invention, the thickness of the zirconium-based metallic glass thin film is preferably 100 nm to 500 nm, such as 200 nm, 300 nm, or 400 nm.

The substrate coated with zirconium-based metallic glass thin film of the present invention may further comprise a buffering layer which is preferably made of titanium and locates between the substrate and the zirconium-based metallic glass thin film, wherein the thickness of the buffering layer is preferably 50 nm, so as to improve the adhesion between the substrate and the zirconium-based metallic glass thin film.

According to the substrate coated with zirconium-based metallic glass thin film of the present invention, the substrate is preferably a 7075-T6 aluminum alloy substrate.

According to the substrate coated with zirconium-based metallic glass thin film of the present invention, the hardness of the substrate coated with zirconium-based metallic glass thin film is preferably 3.5 GPa to 5.5 GPa, e.g. 4.5 GPa.

According to the substrate coated with zirconium-based metallic glass thin film of the present invention, the Young's modulus of the substrate coated with zirconium-based metallic glass thin film is preferably 80 GPa to 100 GPa e.g. 90 GPa.

According to the substrate coated with zirconium-based metallic glass thin film of the present invention, the adhesive force of the zirconium-based metallic glass thin film is preferably 60N to 70N, e.g. 66N. The higher the adhesive force, the more strongly the film is bound. If the adhesive force of the coated thin film to the substrate is insufficient, which then results in peeling of the thin film, the function and mechanical properties of the film may not be realized. Therefore, the adhesive force becomes an important part to evaluate in coated thin films.

The present invention also provides a substrate coated with zirconium-copper-based metallic glass thin film, which comprises: a substrate made of aluminum alloy; and a zirconium-copper-based metallic glass thin film made of zirconium-copper-based metallic glass, which locates on (eg: covers) the surface of the substrate, and the zirconium-copper-based metallic glass is represented by the following formula 2, $$(Zr_e Cu_f Al_g Ag_h)_{100-y} Si_y,$$ [formula 2]

wherein $35 \leq e \leq 55$, $35 \leq f \leq 55$, $5 \leq g \leq 15$, $5 \leq h \leq 15$, $0.1 \leq y \leq 10$.

The substrate coated with zirconium-copper-based metallic glass thin film of the present invention improves many mechanical properties compared to an un-coated aluminum alloy substrate, such as fatigue behavior, surface roughness, hardness, etc. and therefore is able to lengthen the lifespan of the aluminum alloy substrate. Hence, the present invention can be applied to, for example, aviation, shipbuilding, motor industry, bicycle industry, and other equipment requiring materials with excellent fatigue properties, so as to improve the lifespan of the equipment.

According to the substrate coated with zirconium-copper-based metallic glass thin film of the present invention, formula 2 is preferably $(Zr_{42}Cu_{42}Al_8Ag_8)_{99.5}Si_{0.5}$.

According to the substrate coated with zirconium-copper-based metallic glass thin film of the present invention, the surface roughness of substrate coated with zirconium-based metallic glass thin film is preferably 3 nm to 5 nm such as 4 nm.

According to the substrate coated with zirconium-copper-based metallic glass thin film of the present invention, preferably, the fatigue life of the substrate coated with zirconium-copper-based metallic glass thin film is $1.2 \times 10^5$ to $1.2 \times 10^7$ times (e.g. $1.2 \times 10^6$ times) with stress of 300 MPa as measured by a curving fatigue test.

According to the substrate coated with zirconium-copper-based metallic glass thin film of the present invention, the fatigue life of the substrate coated with zirconium-copper-based metallic glass thin film is preferably $1 \times 10^6$ to $1 \times 10^9$ times, more preferably $1 \times 10^6$ to $1 \times 10^8$ times (such as $>10^7$) with stress of 250 MPa measured by a curving fatigue test.

According to the substrate coated with zirconium-copper-based metallic glass thin film of the present invention, the fatigue life of the substrate coated with zirconium-copper-based metallic glass thin film is about 30 to 50 times (e.g. 45 times) of the fatigue life of an uncoated aluminum alloy substrate.

According to the substrate coated with zirconium-copper-based metallic glass thin film of the present invention, the fatigue endurance of the substrate coated with zirconium-copper-based metallic glass thin film is preferably 200 MPa to 300 MPa, such as 250 MPa.

According to the substrate coated with zirconium-copper-based metallic glass thin film of the present invention, the thickness of the zirconium-copper-based metallic glass thin film is preferably 100 nm to 500 nm, such as 200 nm, 300 nm, or 400 nm.

The substrate coated with zirconium-copper-based metallic glass thin film of the present invention may further comprise a buffering layer which is preferably made of titanium and locates between the substrate and the zirconium-copper-based metallic glass thin film, wherein the thickness of the buffering layer is preferably 50 nm, so as to improve the adhesion between the substrate and the zirconium-copper-based metallic glass thin film.

According to the substrate coated with zirconium-copper-based metallic glass thin film of the present invention, the substrate is preferably a 7075-T6 aluminum alloy substrate.

According to the substrate coated with zirconium-copper-based metallic glass thin film of the present invention, the hardness of the substrate coated with zirconium-copper-based metallic glass thin film is preferably 4 GPa to 6 GPa, e.g. 5 GPa.

According to the substrate coated with zirconium-copper-based metallic glass thin film of the present invention, the Young's modulus of the substrate coated with zirconium-copper-based metallic glass thin film is preferably 85 GPa to 105 GPa e.g. 97 GPa.

The present invention further provides a method of forming a zirconium-based metallic glass thin film, comprising steps: (A) providing a zirconium-based metallic glass target made of zirconium-based metallic glass, in which the zirconium-based metallic glass is represented by the following formula 1; and (B) sputtering to form a zirconium-based metallic glass thin film on a substrate by using the zirconium-based metallic glass target as a cathode, in which the substrate is made of aluminum alloy;

$$(Zr_a Cu_b Ni_c Al_d)_{100-x} Si_x,$$ [formula 1]

wherein $45 \leq a \leq 75$, $25 \leq b \leq 35$, $5 \leq c \leq 15$, $5 \leq d \leq 15$, $0.1 \leq x \leq 10$.

The substrate coated with zirconium-based metallic glass thin film made by the method of the present invention may improve many mechanical properties compared to an un-coated aluminum alloy substrate, such as fatigue behavior, surface roughness, hardness, etc. and therefore is able to lengthen the lifespan of the aluminum alloy substrate. Hence, the present invention can be applied to, for example, aviation, shipbuilding, motor industry, bicycle industry, and other equipment requiring materials with excellent fatigue properties, so as to improve the lifespan of the equipment.

According to the method of forming a zirconium-based metallic glass thin film of the present invention, the following formula 1 is preferable $(Zr_{53}Cu_{30}Ni_9Al_8)_{99.5}Si_{0.5}$.

According to the method of forming a zirconium-based metallic glass thin film of the present invention, the zirconium-based metallic glass target is preferably provided by the following steps: (A1) forming an ingot by using raw materials in a composition according to the formula 1 or 2; and (A2) vacuum suction casting the ingot to form the zirconium-based metallic glass target.

According to the method of forming a zirconium-based metallic glass thin film of the present invention, in step (B), the substrate is preferably a 7075-T6 aluminum alloy substrate.

According to the method of forming a zirconium-based metallic glass thin film of the present invention, in step (B), the thickness of the zirconium-based metallic glass thin film is preferably 100 nm to 500 nm, such as 200 nm, 300 nm, or 400 nm.

According to the method of forming a zirconium-based metallic glass thin film of the present invention, the substrate is preferably performed with surface pre-treatment such as polishing, electro polishing (EP), or combinations thereof.

According to the method of forming a zirconium-based metallic glass thin film of the present invention, in step (B), the sputtering step is preferably performed with a gas pressure of $1 \times 10^{-4}$ Pa to $1 \times 10^{-2}$ Pa, e.g. $1 \times 10^{-3}$ Pa.

According to the method of forming a zirconium-based metallic glass thin film of the present invention, in step (B), the sputtering step is preferably performed in a noble gas or nitrogen gas atmosphere. The noble gas, for example, can be helium, neon, argon, etc.

According to the method of forming a zirconium-based metallic glass thin film of the present invention, the hardness of the substrate coated with zirconium-based metallic glass thin film is preferably 3.5 GPa to 5.5 GPa, e.g. 4.5 GPa.

According to the method of forming a zirconium-based metallic glass thin film of the present invention, the Young's modulus of the substrate coated with zirconium-based metallic glass thin film is preferably 80 GPa to 100 GPa, e.g. 90 GPa.

The present invention still further provides a method of forming a zirconium-copper-based metallic glass thin film, which comprises steps: (A) providing a zirconium-copper-based metallic glass target made of zirconium-based metallic glass, and the zirconium-copper-based metallic glass is represented by the following formula 2; and (B) sputtering to form a zirconium-copper-based metallic glass thin film on a substrate by using the zirconium-copper-based metallic glass target as a cathode, in which the substrate is made of aluminum alloy;

$$(Zr_eCu_fAl_gAg_h)_{100-y}Si_y,$$  [formula 2]

wherein $35 \leq e \leq 55$, $35 \leq f \leq 55$, $5 \leq g \leq 15$, $5 \leq h \leq 15$, $0.1 \leq y \leq 10$.

The substrate coated with zirconium-copper-based metallic glass thin film made by the method of the present invention may improve many mechanical properties compared to the un-coated aluminum alloy substrate, such as fatigue behavior, surface roughness, hardness, etc. and therefore is able to lengthen the lifespan of the aluminum alloy substrate. Hence, the present invention can be applied to, for example, aviation, shipbuilding, motor industry, bicycle industry, and other equipment requiring materials with excellent fatigue properties, so as to improve the lifespan of the equipment.

According to the method of forming a zirconium-copper-based metallic glass thin film of the present invention, formula 2 is preferably $(Zr_{42}Cu_{42}Al_8Ag_8)_{99.5}Si_{0.5}$.

According to the method of forming a zirconium-copper-based metallic glass thin film of the present invention, the zirconium-based metallic glass target is preferably provided by the following steps: (A1) forming an ingot by using raw materials in a composition according to formula 1 or 2; and (A2) vacuum suction casting the ingot to form the zirconium-based metallic glass target.

According to the method of forming a zirconium-copper-based metallic glass thin film of the present invention, in step (A1), the casting is preferably arc casting.

According to the method of forming a zirconium-copper-based metallic glass thin film of the present invention, in step (B), the substrate is preferably a 7075-T6 aluminum alloy substrate.

According to the method of forming a zirconium-copper-based metallic glass thin film of the present invention, in step (B), the thickness of the zirconium-copper-based metallic glass thin film is preferably 100 nm to 500 nm, such as 200 nm, 300 nm, or 400 nm.

According to the method of forming a zirconium-copper-based metallic glass thin film of the present invention, the substrate is preferably performed with surface pre-treatment such as polishing, electro polishing (EP), or combinations thereof.

According to the method of forming a zirconium-copper-based metallic glass thin film of the present invention, in step (B), the sputtering step is preferably performed with a gas pressure of $1 \times 10^{-4}$ Pa to $1 \times 10^{-2}$ Pa, e.g. $1 \times 10^{-3}$ Pa.

According to the method of forming a zirconium-copper-based metallic glass thin film of the present invention, in step (B), the sputtering step is preferably performed in a noble gas or nitrogen gas atmosphere. The noble gas, for example, can be helium, neon, argon, etc.

According to the method of forming a zirconium-copper-based metallic glass thin film of the present invention, the hardness of the substrate coated with zirconium-copper-based metallic glass thin film is preferably 4 GPa to 6 GPa, e.g. 5 GPa.

According to the method of forming a zirconium-copper-based metallic glass thin film of the present invention, the Young's modulus of the substrate coated with zirconium-copper-based metallic glass thin film is preferably 85 GPa to 105 GPa, e.g. 97 GPa.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
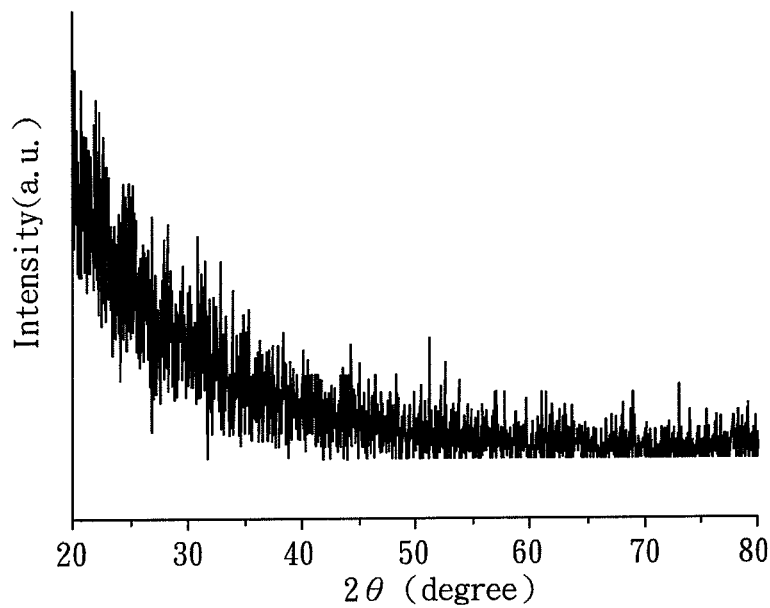
FIG. 1 is an X-ray diffraction test result of the substrate coated with zirconium-based metallic glass thin film of the example of the present invention.

Now, the present invention will be described in more detail with reference to the following Examples. These examples are provided only for illustrating the present invention and should not be construed as limiting the scope and spirit of the present invention. Many other possible modifications and variations of any detail in the present specification based on different outlooks and applications can be made without departing from the spirit of the invention.

EXAMPLE 1

Forming of Zirconium-Based Metallic Glass $((Zr_{53}Cu_{30}Ni_9Al_8)_{99.5}Si_{0.5})$ Thin Film on the Substrate 1. Preparation of Target Raw materials are prepared in a composition of $Zr_{53}Cu_{30}Ni_9Al_8)_{99.5}Si_{0.5}$ and are mixed to give a mixture. The mixture is then arc-cast (using Lincoln electric INVERTEC V450-PRO) to provide an ingot in a circular shape.

The surface of the ingot is cleaned by, for example, removing the oxide layer on the surface of the ingot using a shot-blasting machine, followed by placing the ingot in a beaker filled with alchohol and ultrasonic-cleaning of the surface of the ingot. After that, the cleaned ingot is placed in a vacuum suction casting furnace to be vacuum-cast under an argon-atmosphere with controlled temperature (by a constant temperature control system), and followed by rapid-cooling to obtain a metallic glass alloy plate. The alloy plate is cut by a wire-cut EDM to provide several blocks of targets (i.e. the metallic glass target of the present example) about 2 inches in diameter.

2. Sputtering to Form Zirconium-Based Metallic Glass Thin Film 2-1. Pre-Treatment of Aluminum Alloy Substrate A 7075-T6 aluminum alloy substrate is polished with an abrasive paper. It should be noted herein that the abrasive paper (i.e. sand paper) should be used in a series according to the number of the paper ranging from small to large, for example, the abrasive paper should be used in a number sequence from 1000 to 4000. Herein, the aluminum alloy substrate can be any aluminum alloy substrate, and is not limited to 7075-T6 aluminum alloy substrate. The polished 7075-T6 aluminum alloy substrate is then electrolytic polished, in which the electrolytic polishing fluid comprises 78 ml of $CH_3COOH$, 22 ml of $HClO_4$, and 0.4 g of Al powder. During electrolytic polishing, the substrate is placed at a positive electrode (+), and a stainless steel plate serves as a negative electrode (−). The temperature of the electrolyte should be controlled to be less than 45° C., and therefore a constant temperature control system is used. Electrolytic polishing is performed using a direct current electrolyze polish machine, wherein a current density is 5 $A/dm^2$, a working voltage is 50 V, and one operation time is 30 seconds.

2-2. Formation of the Buffering Layer

In order to increase the adhesive force between the thin film and the aluminum alloy substrate, a buffering layer with a thickness of 50 nm is deposited on the substrate, and the material of the buffering layer is titanium.

2-3. Sputtering

Herein, the metallic glass target serves as a cathode and the substrate, having a buffering layer thereon for sputtering, serves as an anode, and a DC Magnetron Sputter machine is used to form the metallic glass thin film of the present example. The chamber of the sputtering machine is vacuumed to $10^{-3}$ Pa, argon gas is directed into the chamber and a DC high voltage is used during the sputtering process so as to form a zirconium-based metallic glass thin film (in a composition of $(Zr_{53}Cu_{30}Ni_9Al_8)_{99.5}Si_{0.5}$) having a thickness of 200 nm on the buffering layer. A substrate coated with zirconium-based metallic glass thin film of the present example is thus obtained.

EXAMPLE 2

Formation of Zirconium-Copper-Based Metallic Glass Thin Film ($(Zr_{42}Cu_{42}Al_8Ag_8)_{99.5}Si_{0.5}$)

Except that the composition of the raw materials is changed into $((Zr_{42}Cu_{42}Al_8Ag_8)_{99.5}Si_{0.5})$, the other conditions and materials used in the present example are the same as those shown in the example 1, so as to form the zirconium-copper-based metallic glass target of the present example.

The zirconium-copper-based metallic glass target is then used to form a zirconium-copper-based metallic glass thin film on a 7075-T6 aluminum alloy substrate. Therefore, a substrate coated with zirconium-copper-based metallic glass thin film of the present example is thus obtained.

TESTING EXAMPLE 1

Energy Dispersive Spectrometry (EDS) Analysis

The substrate coated with zirconium-based metallic glass thin film and the substrate coated with zirconium-copper-based metallic glass thin film according to the examples 1 and 2 respectively are taken to a component analysis by an energy dispersive spectrometry method, and the results are shown in the table 1 below.

As shown in the table 1, since the content of silicon is only 0.5 at. %, which is too rare to be detected, there is no silicon-relative peak being detected, but the detected peaks of zirconium, aluminum, copper, nickel, silver are revealed in a reasonable range.

TABLE 1

|  |  | Theory Atom % | EDS result Atom % |
|---|---|---|---|
| zirconium-based metallic glass thin film | Zr | 52.735 | 50.765 |
|  | Cu | 29.85 | 28.536 |
|  | Al | 8.955 | 8.459 |
|  | Ni | 7.96 | 12.240 |
|  | Si | 0.5 | 0 |
| zirconium-copper-based metallic glass thin film | Zr | 41.79 | 42.181 |
|  | Cu | 41.79 | 42.297 |
|  | Al | 7.96 | 8.46 |
|  | Ag | 7.96 | 7.062 |
|  | Si | 0.50 | 0 |

TESTING EXAMPLE 2

X-ray Diffraction (XRD) Analysis

Small angle X-ray scattering is performed using Shimadzu XRD-6000 to estimate the crystalline structure and properties of the thin film. The scattering angle 2θ of the X-ray diffraction ranges from 20 degrees to 80 degrees, and the scanning speed is 4°/min.

Figure 2:
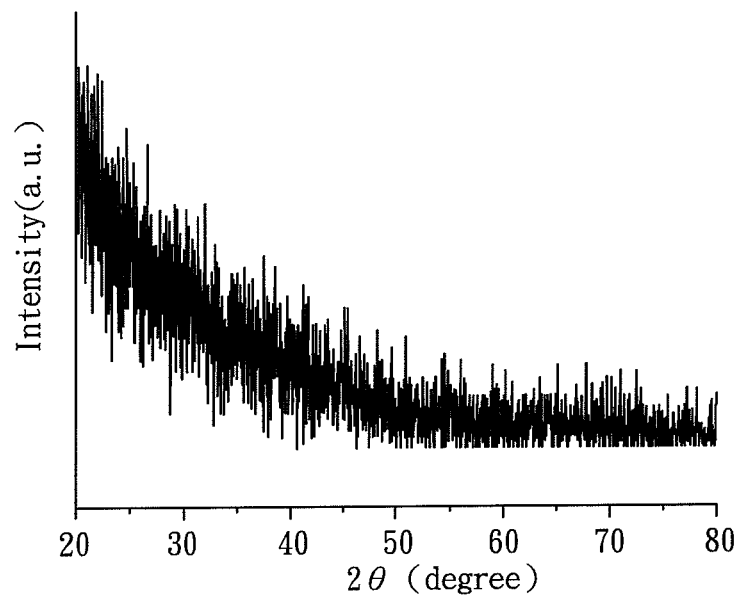
FIG. 2 is an X-ray diffraction test result of the substrate coated with zirconium-copper-based metallic glass thin film of the example of the present invention.

FIG. 1 shows the result of X-ray diffraction analysis of the zirconium-based metallic glass thin film of example 1, and FIG. 2 shows the result of X-ray diffraction analysis of the zirconium-copper-based metallic glass thin film of example 2. It can be seen that no sharp peak appears in the figures, which means the thin films provided from examples 1 and 2 are in a metallic glass state.

"An amorphous metal" means that the metal atoms in the amorphous metal have no long-term continuous regular arrangement, only short term-regular arrangement. Amorphous metals also can be called liquid metals or non-crystalline metals, or glassy metals or metallic glass, due to their similar behavior to glass in lacking long-term continuous regular arrangement. Long-term continuous regular arrangement of metal atoms usually occurs when an alloy is cooled with a slow cooling rate. In contrast, metallic glass alloys are formed when the alloy is cooled with a very fast cooling rate, e.g. 106 to 1010 K/sec. Under an X-ray diffraction test, a broad band can be observed with metallic glass alloys at a low diffraction angle (i.e. 2θ=30 to 50 degree), while a sharp peak is revealed with a crystalline metal alloy.

The present testing example uses X-ray diffraction analysis to prove that the metallic glass alloy thin film from examples 1 and 2 are all in a metallic glass state.

TESTING EXAMPLE 3

Thin Film Scratching Test

The thin film scratching test is a very important test for sputtered thin film to evaluate the adhesive force between the thin film and the coated substrate. If the adhesive force of the coated thin film to the substrate is insufficient, the function and mechanical properties of the film may not be realized. Therefore, the adhesive force becomes an important part to evaluate in coated thin films.

In the present testing example, the substrate coated with zirconium-based metallic glass thin film and the substrate coated with zirconium-copper-based metallic glass thin film according to examples 1 and 2 respectively, are taken for an adhesive force test. The method for testing the adhesive force comprises steps: smoothing the curve from the graph obtained by a scratching test, and taking the first derivative. After the derivation, the value corresponding to the maximum is the desired minimum force that can destroy the film (i.e. the critical loading (Lc)).

According to the present testing example, the adhesive force of the zirconium-based and zirconium-copper-based metallic glass thin films in examples 1 and 2 respectively are 66 N and 90 N. It can be seen that the adhesive force of the zirconium-copper-based metallic glass thin film is higher than that of the zirconium-based metallic glass thin film, in which a higher adhesive force means that the film is more strongly bound.

TESTING EXAMPLE 4

Atomic Force Microscopy (AFM) Analysis

The substrate coated with zirconium-based metallic glass thin film and the substrate coated with zirconium-copper-based metallic glass thin film according to examples 1 and 2 respectively, as well as an electrolytic polished aluminum substrate which is not coated with a metallic glass thin film, are taken for an atomic force microscopy (AFM) analysis.

According to the results, the surface roughness of the electrolytic polished substrate that is not coated with a metallic glass thin film is 6.3 nm, the surface roughness of the substrate coated with zirconium-based metallic glass thin film of example 1 is 4.5 nm, and the surface roughness of the substrate coated with zirconium-copper-based metallic glass thin film of example 2 is 4.1 nm. Therefore, it is proved that according to the surface treatment of coating a metallic glass thin film on a substrate of the present invention, the surface roughness can be reduced, a scratch can be mitigated, and the number of scratches can be lowered. Therefore, the fatigue behavior of the substrate can be improved according to the coating of the zirconium-based or zirconium-copper-based metallic thin film of the present invention.

TESTING EXAMPLE 5

Nano-Indentation Test

The substrate coated with zirconium-based metallic glass thin film and the substrate coated with zirconium-copper-based metallic glass thin film according to examples 1 and 2 respectively, and an electrolytic polished substrate which is not coated with a metallic glass thin film, are taken for a nano-indentation test.

A nanoindenter (TriboLab, Hysitron, USA) is used for the nano-indentation test in the present testing example, the depth of the indentation during the measurement should not be more than $\frac{1}{10}$ of the film thickness, 10 uniformly distributed press-points on the film are measured, and an average value is obtained to evaluate the hardness of the film.

According to the result, the hardness of the zirconium-based and zirconium-copper-based metallic glass thin films of examples 1 and 2 are 4.5 GPa and 5 GPa respectively, and the Young's modulus of the films of examples 1 and 2 are 90 GPa and 97 GPa respectively. The hardness of the electrolytic polished substrate which is not coated with a metallic glass thin film is only 1.7 GPa, and the Young's modulus is only 72 GPa. Therefore, it is proved that the metallic glass thin film coating of the present invention is able to improve the Young's modulus and the hardness of a substrate.

TESTING EXAMPLE 6

Four Points Curving Fatigue Test

A material test system (MTS-858 Mini Bionix II) is used in the present testing example. A four points curving fatigue test according to the standard of ASTM C1161-02c is performed on substrates coated with zirconium-based and zirconium-copper-based metallic glass thin films of examples 1 and 2 respectively and an electrolytic polished aluminum substrate which is not coated with a metallic glass thin film (control group). The results of fatigue life with different stresses for each group are obtained.

According to the result, when the applied stress is 300 MPa, the fatigue life of the substrate which is not coated with a metallic glass thin film is $7.5 \times 10^4$ times, the fatigue life of the substrate coated with zirconium-based metallic glass thin film of example 1 is $5 \times 10^5$ times, and the fatigue life of the substrate coated with zirconium-copper-based metallic glass thin film of example 2 is $1.2 \times 10^6$ times. Therefore, it is proved that the metallic glass thin film coating of the present invention is able to improve the fatigue life of a substrate. Also, with a decrease of the applied stress, the increasing of the fatigue life is more obvious. For example, when the applied stress is 250 MPa, the fatigue life of the substrate which is not coated with a metallic glass thin film is $2.2 \times 10^5$ times, the fatigue life of the substrate coated with zirconium-based metallic glass thin film of example 1 is $5.0 \times 10^6$ times, and the fatigue life of the substrate coated with zirconium-copper-based metallic glass thin film of example 2 is more than $10^7$ times. That is, the zirconium-based and zirconium-copper-based metallic glass thin films can increase the fatigue life to about 22 times and 45 times respectively compared to the un-coated aluminum substrate.

As mentioned above, the substrate coated with zirconium-based metallic glass thin film of the present invention improves many mechanical properties, such as fatigue behavior, surface roughness, hardness, etc, compared to the un-coated aluminum alloy substrate, and therefore is able to lengthen the lifespan of the aluminum alloy substrate. Hence, the present invention can be applied to, for example, aviation, shipbuilding, motor industry, bicycle industry, and other equipment requiring materials with excellent fatigue properties, so as to improve the lifespan of the equipment.

Although the present invention has been explained in relation to its preferred embodiment, it is to be understood that many other possible modifications and variations can be made without departing from the spirit and scope of the invention as hereinafter claimed.

What is claimed is:

1. A substrate coated with zirconium-copper-based metallic glass thin film, which comprises:
   a substrate made of aluminum alloy; and
   a zirconium-copper-based metallic glass thin film made of zirconium-copper-based metallic glass, which locates on the surface of the substrate, and the zirconium-copper-based metallic glass is formed by sputtering a zirconium-copper-based metallic glass target represented by the following formula 2, wherein formula 2 is $(Zr_eCu_fAl_gAg_h)_{100-y}Si_y$, wherein 35≤e≤55, 35≤f≤55, 5≤g≤15, 5≤h≤15, and 0.1≤y≤10.

2. The substrate coated with zirconium-copper-based metallic glass thin film as claimed in claim 1, wherein the fatigue life of the substrate coated with zirconium-copper-based metallic glass thin film is $1\times10^6$ to $1\times10^9$ times with stress of 250 MPa measured by a curving fatigue test.

3. The substrate coated with zirconium-copper-based metallic glass thin film as claimed in claim 1, wherein fatigue endurance of the substrate coated with zirconium-copper-based metallic glass thin film is 200 MPa to 300 MPa.

4. The substrate coated with zirconium-copper-based metallic glass thin film as claimed in claim 1, wherein the thickness of the zirconium-copper-based metallic glass thin film is 100 nm to 500 nm.

5. The substrate coated with zirconium-copper-based metallic glass thin film as claimed in claim 1, wherein the hardness of the substrate coated with zirconium-copper-based metallic glass thin film is 4 GPa to 6 GPa.

6. The substrate coated with zirconium-copper-based metallic glass thin film as claimed in claim 1, wherein the Young's modulus of the substrate coated with zirconium-copper-based metallic glass thin film is 85 GPa to 105 GPa.

7. A method of forming a zirconium-copper-based metallic glass thin film of claim 1, comprising steps:

(A) providing said zirconium-copper-based metallic glass target made of zirconium-based metallic glass, wherein the zirconium-copper-based metallic glass target is provided by the following steps:
(A1) forming an ingot by using raw materials in a composition according to said target composition; and
(A2) vacuum suction casting the ingot to form said zirconium-copper-based metallic glass target; and
(B) sputtering to form a zirconium-copper-based metallic glass thin film on a substrate by using said zirconium-copper-based metallic glass target as a cathode, in which the substrate is made of aluminum alloy.

8. The method of forming a zirconium-copper-based metallic glass thin film as claimed in claim 7, wherein in step (B), the thickness of the zirconium-copper-based metallic glass thin film is 100 nm to 500 nm.

9. The method of forming a zirconium-copper-based metallic glass thin film as claimed in claim 7, wherein in step (B), the sputtering step is performed with a gas pressure of $1\times10^{-4}$ Pa to $1\times10^{-2}$ Pa.

10. The method of forming a zirconium-copper-based metallic glass thin film as claimed in claim 7, wherein the hardness of the substrate coated with zirconium-copper-based metallic glass thin film is 4 GPa to 6 GPa.

11. The method of forming a zirconium-copper-based metallic glass thin film as claimed in claim 7, wherein the Young's modulus of the substrate coated with zirconium-copper-based metallic glass thin film is 85 GPa to 105 GPa.

* * * * *